United States Patent
Vogt

(10) Patent No.: US 6,798,588 B2
(45) Date of Patent: Sep. 28, 2004

(54) METHOD FOR APPLYING A SCALE TO A CARRIER

(75) Inventor: Peter Vogt, Heidenheim (DE)

(73) Assignee: Carl Zeiss SMT AG (DE)

( * ) Notice: Subject to any disclaimer, the term of this patent is extended or adjusted under 35 U.S.C. 154(b) by 154 days.

(21) Appl. No.: 10/278,957

(22) Filed: Oct. 22, 2002

(65) Prior Publication Data

US 2003/0090639 A1 May 15, 2003

(30) Foreign Application Priority Data

Oct. 27, 2001 (DE) .......................................... 101 53 147

(51) Int. Cl.[7] .............................. G02B 7/02; G03B 27/42
(52) U.S. Cl. ........................ 359/819; 359/820; 355/53
(58) Field of Search .............................. 359/819, 820, 359/822, 823, 811; 355/53, 51, 67

(56) References Cited

U.S. PATENT DOCUMENTS 4,162,120 A * 7/1979 Moreno ...................... 359/820
5,210,650 A * 5/1993 O'Brien et al. ............. 359/820

* cited by examiner

Primary Examiner—Tim Thompson
(74) Attorney, Agent, or Firm—Wells St. John P.S.

(57) ABSTRACT

In a method for applying a scale (7) to a carrier (1,2), a material layer (11) is applied to the carrier in such a way that the change in length on account of temperature change of the material layer (11) corresponds at least approximately to changes in length of the carrier (1,2) on account of temperature change. The scale (7) is introduced into or applied to the material layer (11) with a measuring graduation (7a). The carrier may be an optical element, e.g. a lens (1) of an objective (5) for semiconductor lithography.

41 Claims, 1 Drawing Sheet

METHOD FOR APPLYING A SCALE TO A CARRIER

CROSS REFERENCE TO RELATED APPLICATION

This application relates to and claims priority to corresponding Germany Patent Application No. 101 53 147.8, which was filed on Oct. 27, 2001, and which is incorporated by reference herein.

BACKGROUND OF THE INVENTION

1. Field of the Invention

The invention relates to a method for applying a scale to a carrier, in particular to an optical element of an objective as carrier, more particular to a lens.

The invention also relates to an objective for semiconductor lithography, a scale with a measuring graduation being applied to a lens or an inner holder.

When carrying out changes in position of an optical element in an objective, e.g. on the lens which is mounted in an inner holder and which is connected to an outer holder via corresponding intermediate elements, it is advantageous to determine the position of the change in position of the optical element when this experiences a corresponding offset, e.g. through the use of manipulators.

2. Description of the Related Art

It is known to arrange on one of the two holder parts, preferably the inner holder, a separate glass carrier which is provided with a scale with an etched-in measuring graduation. In this case, the glass carrier is connected to the underlying holder, which is generally composed of steel, via fixing elements. Besides the disadvantage of an additional component and an associated higher fixing outlay, a further disadvantage of the known measuring method resides in different thermal expansions between the glass carrier with the scale and the holder on which the glass carrier with the scale is arranged. As a result of the different thermal expansions between the two parts, there is the risk of the measurement result becoming more inaccurate.

SUMMARY OF THE INVENTION

Therefore, the present invention is based on the object of providing a method for applying a scale to a carrier and an apparatus therefore which can be used to carry out measurements with simple means, with the possibility, in particular, of effecting measurement with higher accuracy and with relatively simple means, in the case of an offset of an optical element.

According to the invention, this object is achieved by means of a method for applying a scale to a carrier, a material layer being applied to said carrier in such a way that changes in length of the material layer on account of temperature changes correspond at least approximately to changes in length of said carrier on account of temperature changes, and said scale being introduced into or applied to said material layer with a measuring graduation.

More specifically, this object is achieved by means of a method for applying a scale to an optical element of an objective for semiconductor lithography, a material layer being applied to an optical element in such a way that changes in length of said material layer on account of temperature changes correspond at least approximately to changes in length of said optical element on account of temperature changes, and said scale being introduced into or applied to said material layer with a measuring graduation.

This object is also achieved in an objective for semiconductor lithography, wherein a scale being provided on an inner holder or on a lens.

By virtue of the fact that a material layer is applied directly to the carrier, e.g. to an optical element of an objective, such as e.g. an objective for semiconductor lithography, the thermal expansion profile of the carrier being forced on the thermal expansion profile of said material layer, on the one hand separate fixing elements for the scale are avoided and on the other hand problems with a varying thermal expansion coefficient no longer arise. This means that the position and changes in position of the carrier, e.g. a lens, can be ascertained with significantly higher accuracy.

In a highly advantageous improvement of the invention, it may be provided that the scale is introduced directly into the carrier, e.g. the holder of a lens, or else is introduced into or applied to the lens itself in an optically inactive region, i.e. into a region which is not required for the exposure.

In a further embodiment of the invention, it may be provided that the material layer for the scale has at least approximately the same thermal expansion coefficient as the carrier. If e.g. a lens is provided as the carrier, then the material layer for the scale may be composed of the same material as the lens. Identical thermal expansion coefficients are thus present in this case. The same material layer also results automatically when the scale is introduced directly into the lens itself, e.g. through corresponding etching-in or scribing-in.

In a highly advantageous further improvement of the invention, it may be provided that glass is used as the material layer, the measuring graduation of the scale being applied to the glass layer. In this case, the measuring graduation of the scale may be vapor-deposited onto the glass layer.

The application of the material layer to the carrier, e.g. a lens or the holder of a lens, may be effected by sputtering or vapor deposition.

If the scale is arranged on the lens or on the inner holder of the lens, then corresponding measuring elements for measurement, e.g. a sensor, which measures the position and the displacement distances of the lens by means of the measuring graduation of the scale will be provided on the associated outer holder or in a corresponding region of the objective.

A possible sensor is e.g. an incremental capacitive or incremental inductive sensor, an interferometric transmitter or else another sensor which operates with the desired high measurement accuracy, which should lie in the nanometers range.

Advantageous developments and improvements emerge from the rest of the subclaims and from the exemplary embodiments, whose principles are described below with reference to the drawing.

DETAILED DESCRIPTION

Figure 1:
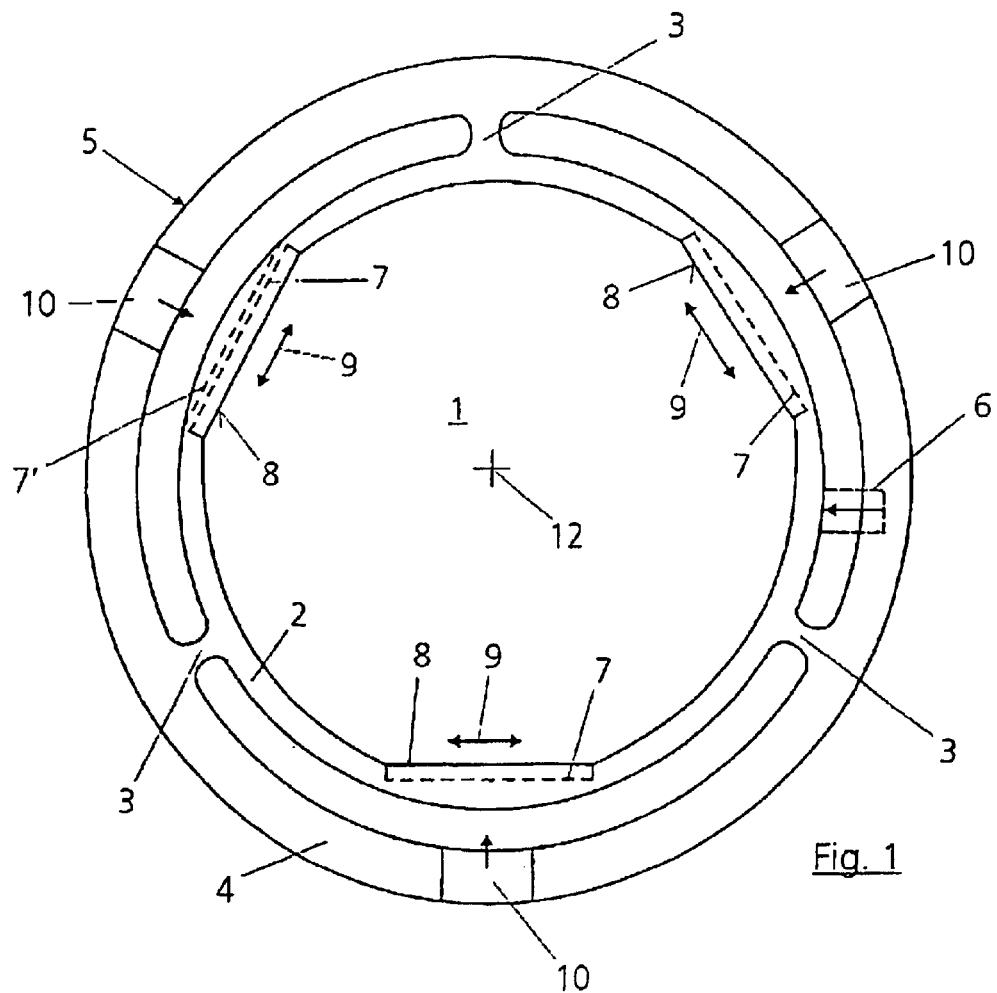
FIG. 1 shows a plan view of a lens which is connected to an outer holder via an inner holder and elastic connecting elements.

The invention is described below by way of example for an objective which is provided for semiconductor lithography. It goes without saying that the method according to the invention is also suitable for other objectives. Furthermore, use is also possible in other technical fields in which it is important to perform measurements with a very high accuracy.

A lens 1, which in this case functions as a carrier, is mounted in a known manner in an inner holder 2. The inner holder 2 is connected to an outer holder 4, which forms a fixed part of an objective 5, via one or more connecting elements 3 arranged in a distributed manner over the periphery. The inner holder 2 and outer holder 4 may be designed in one piece together with the connecting elements 3.

By means of actuators 6 not illustrated in greater detail (only one actuator is illustrated by broken lines for example in FIG. 1), it is possible to carry out displacements of the inner holder 2 and thus also of the lens 1 in the x/y direction, i.e. right-angled to the optical axis and in the plane of the lens, in accordance with the direction of the arrow or else in the direction of the optical axis, which is perpendicular to the lens plane. These displacements may be in the nanometers range.

In order, then, to determine these displacements or the offset of the inner holder 2 relative to the outer holder 4, a plurality of scales 7 arranged in a distributed manner over the periphery are provided, which are arranged on the lens 1 as carrier. In a different configuration, the scales 7 are arranged on the inner holder as carrier. In the exemplary embodiment illustrated in FIG. 1, three scales 7 arranged in a manner distributed uniformly over the periphery are provided, which are fitted on flattened portions 8 in the peripheral wall of the lens 1. In principle, two scales 7 arranged at a right angle to one another on the periphery of the lens 1 suffice for detecting displacements in the x/y direction. If three scales 7 with corresponding measurements are provided, then it is also possible for displacements of the center of the lens 1 or the off-centering thereof to be determined exactly. The respective measuring directions are specified by arrows 9 in FIG. 1.

If the intention is to measure displacements of the lens 1 in the z-direction of the captical axis, the scales 7 are to be correspondingly arranged axially (in the direction of the optical axis) along the peripheral wall of the lens 1. In the exemplary embodiment illustrated, this means that the scales 7 are perpendicular to the plane of the drawing.

The position of a scale 7' is also additionally illustrated by broken lines in FIG. 1, which scale is arranged on a corresponding flattened portion on the outer peripheral wall of the inner holder 2. If the inner holder 2 is fixedly connected to the lens 1, displacements of the lens 1 relative to the outer holder 4 can also be ascertained in the case of an arrangement of scales 7' on the inner holder 2.

Sensors 10 are provided for the purpose of measuring the displacement of the lens 1, which sensors are arranged on the outer holder 4 or another part of the objective 5 and are directed at the scales 7 or evaluate the latter.

Since such sensors 10 are known in principle, they are only indicated to a basic extent in FIG. 1. What are suitable for this purpose are e.g. capacitive or inductive sensors or else interferometric transmitters such as e.g. grating interferometers, as described e.g. in the journal "Feinwerktechnik & Meßtechnik 98 (1990) 10", page 406 in the article "Längen in der Ultra-präzisionsmeßtechnik messen" ["Measuring lengths in ultraprecision measurement technology"].

Figures 2A, 2B, 2C:
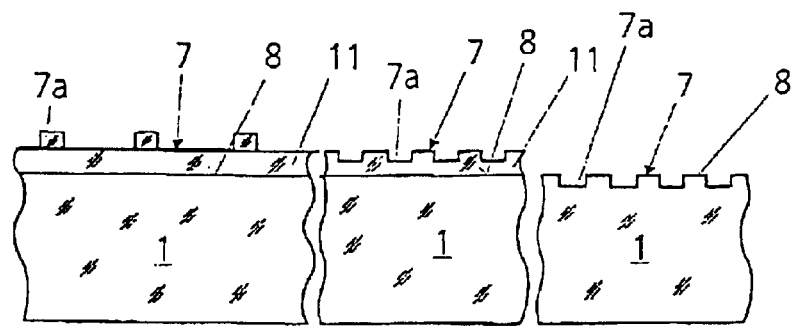
FIGS. 2a to 2c show enlarged illustrations of a scale introduced or applied to the lens.

FIGS. 2a, 2b and 2c specify for example three possibilities for applying the scale 7 to the lens 1 or the inner holder 2.

In accordance with FIG. 2a a material layer 11 is applied to the flattened portion 8 on the peripheral wall of the lens 1, said material layer having the same thermal expansion behavior as the lens 1 itself. Preferably, the same material which is also used for the lens 1 is taken for this, if possible. E.g. glass can be used as the material layer 11 which is correspondingly applied to the lens 1, in which case the thickness of the glass may between 2 and $7\mu$.

In accordance with FIG. 2a, the scale 7 with the measuring graduation 7a is then applied to the material layer 11. This can be effected e.g. by vapor deposition. For the scale 7 it is likewise possible to use glass or also another material such as e.g. a metal, in particular chromium, aluminum or silver.

Instead of vapor deposition of the measuring graduation 7a, the latter can also be etched into the material layer 11, as is illustrated in FIG. 2b.

During the application of the material layer for the scale to the carrier, it is merely necessary to ensure that this is applied, for the case where different materials are present, only with such a small thickness that the thermal expansion profile of the carrier is forced on the material layer.

If identical or similar thermal expansion coefficients are present for the carrier and the material layer, then the thickness of the material layer has no influence on any varying thermal expansion profile. This is case e.g. when both carrier and material layer are composed of the same material.

FIG. 2c shows a configuration of a scale 7, the measuring graduation 7a being etched directly into the lens 1, into a corresponding flattened portion 8 of the lens 1.

Instead of application of the scale 7 to the carrier, in the exemplary embodiment the lens 1 or the inner holder 2, by sputtering of the material layer 11, it is also possible, if appropriate, for a scale 7 with the measuring graduation 7a to be applied by wringing onto the flattened portion 8 of the lens 1.

What is claimed is:

1. A method for applying a scale to a carrier, a material layer being applied to said carrier in such a way that changes in length of the material layer on account of temperature changes correspond at least approximately to changes in length of said carrier on account of temperature changes, and said scale being introduced into or applied to said material layer with a measuring graduation.

2. A method for applying a scale to an optical element of an objective for semiconductor lithography, a material layer being applied to an optical element in such a way that changes in length of said material layer on account of temperature changes correspond at least approximately to changes in length of said optical element on account of temperature changes, and said scale being introduced into or applied to said material layer with a measuring graduation.

3. The method as claimed in claim 2, wherein said optical element forms a part of a holder of a lens.

4. The method as claimed in claim 2, wherein said optical element is a lens, and wherein said scale is fitted on an optically inactive part of said lens.

5. The method as claimed in claim 2, wherein glass is applied as said material layer, the measuring graduation of said scale being applied to said glass layer.

6. The method as claimed in claim 5, wherein the measuring graduation is vapor-deposited onto a quartz layer.

7. The method as claimed in claim 6, wherein magnesium fluoride, quartz or a metal is vapor-deposited.

8. The method as claimed in claim 2, wherein said material layer is sputtered onto said optical element.

9. The method as claimed in claim 8, wherein quartz is sputtered onto said optical element.

10. The method as claimed in claim 8, wherein said material layer is polished after the sputtering and before the application of said measuring graduation.

11. The method as claimed in claim 1, wherein said material layer has at least approximately the same thermal expansion coefficient as said carrier.

12. The method as claimed in claim 1, wherein said material layer is applied to said carrier with such a small thickness compared with said carrier that the thermal expansion profile of said carrier is forced on said material layer.

13. An objective for semiconductor lithography having at least one lens mounted in an inner holder, said inner holder being connected to an outer holder by at least one connecting element, said inner holder being provided with a scale formed by a material layer into which or to which said scale is introduced or applied with a measuring graduation, and said material layer having such a small thickness compared with said inner holder that the thermal expansion profile of said inner holder is forced on said material layer.

14. An objective for semiconductor lithography having at least one lens mounted in an inner holder, said inner holder being connected to an outer holder by at least one connecting element, said inner holder being provided with a scale formed by a material layer into which or to which said scale is introduced or applied with a measuring graduation, and said scale and said material layer being composed of the same material as said inner holder.

15. An objective for semiconductor lithography having at least one lens mounted in an inner holder, said inner holder being connected to an outer holder by at least one connecting element, said lens being provided with said scale formed by a material layer into which or to which said scale is introduced or applied with a measuring graduation, and said material layer having at least approximately the same thermal expansion coefficient as the thermal expansion coefficient of said lens.

16. The objective as claimed in claim 15, wherein said material layer is composed of the same material as said lens.

17. The objective as claimed in claim 15, wherein said scale is composed of the same material as said lens.

18. The objective as claimed in claim 13, wherein quartz, in particular with a thickness of greater than $2\mu$, is applied as said material layer, said measuring graduation being applied to the quartz layer.

19. The objective as claimed in claim 15, wherein quartz, in particular with a thickness of greater than $2\mu$, is applied as said material layer, said measuring graduation being applied to the quartz layer.

20. The objective as claimed in claim 18, wherein the measuring graduation is vapor-deposited onto the quartz layer.

21. The objective as claimed in claim 19, wherein the measuring graduation is vapor-deposited onto the quartz layer.

22. The objective as claimed in claim 20, wherein magnesium fluoride, quartz or metal is vapor-deposited.

23. The objective as claimed in claim 21, wherein magnesium fluoride, quartz or metal is vapor-deposited.

24. The objective as claimed in claim 13, wherein said material layer is sputtered onto said holder.

25. The objective as claimed in claim 15, wherein said material layer is sputtered onto the lens.

26. The objective as claimed in claim 15, wherein said scale is wrung onto the lens.

27. An objective for semiconductor lithography having at least one lens mounted in an inner holder, said inner holder being connected to an outer holder by at least one connecting element, said lens being provided with a scale which is introduced directly into the peripheral wall of said lens.

28. The objective as claimed in claim 27, wherein said scale is introduced into a flattened portion of said peripheral wall.

29. The objective as claimed in claim 27, wherein the measuring graduation of said scale is etched into the material of said lens.

30. The objective as claimed in claim 13, wherein the outer holder is provided with at least one sensor which measures displacement distances of said lens by means of said scale.

31. The objective as claimed in claim 14, wherein the outer holder is provided with at least one sensor which measures displacement distances of said lens by means of said scale.

32. The objective as claimed in claim 15, wherein the outer holder is provided with at least one sensor which measures displacement distances of said lens by means of said scale.

33. The objective as claimed in claim 27, wherein the outer holder is provided with at least one sensor which measures displacement distances of said lens by means of said scale.

34. The objective as claimed in claim 13, wherein said scale is arranged for measuring displacements in the direction of the optical axis.

35. The objective as claimed in claim 14, wherein said scale is arranged for measuring displacements in the direction of the optical axis.

36. The objective as claimed in claim 15, wherein said scale is arranged for measuring displacements in the direction of the optical axis.

37. The objective as claimed in claim 27, wherein said scale is arranged for measuring displacements in the direction of the optical axis.

38. The objective as claimed in claim 13, wherein said scale is arranged for measuring displacements in right-angled direction to the optical axis.

39. The objective as claimed in claim 14, wherein said scale is arranged for measuring displacements in right-angled direction to the optical axis.

40. The objective as claimed in claim 15, wherein said scale is arranged for measuring displacements in right-angled direction to the optical axis.

41. The objective as claimed in claim 27, wherein said scale is arranged for measuring displacements in right-angled direction to the optical axis.

* * * * *

UNITED STATES PATENT AND TRADEMARK OFFICE
CERTIFICATE OF CORRECTION

PATENT NO. : 6,798,588 B2
DATED : September 28, 2004
INVENTOR(S) : Peter Vogt

It is certified that error appears in the above-identified patent and that said Letters Patent is hereby corrected as shown below:

Column 1,
Line 7, replace "Germany Patent Application No. 101 53 147.8," with
-- German Patent Application No. 101 53 147.8, --
Line 24, replace "to determine the position of the change in position of the" with
-- to determine the position or the change in position of the --

Column 3,
Line 62, replace ""Längen in der Ultra-präzisionsmeβtechnik messen"" with
-- Längen in der Ultrapräzisionsmeβtechnik messen --

Column 4,
Line 8, replace "thickness of the glass may between 2 and $7\mu$." with -- thickness of the glass may be between 2 and $7\mu$. --
Line 12, replace "it is likewise possible to use glass or also another material" with
-- it is likewise possible to use glass or else another material --

Signed and Sealed this

Twelfth Day of April, 2005

JON W. DUDAS
*Director of the United States Patent and Trademark Office*